United States Patent
Cok

(10) Patent No.: US 7,106,307 B2
(45) Date of Patent: *Sep. 12, 2006

(54) TOUCH SCREEN FOR USE WITH AN OLED DISPLAY

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 756 days.

This patent is subject to a terminal disclaimer.

(21) Appl. No.: 09/864,484

(22) Filed: May 24, 2001

(65) Prior Publication Data

US 2002/0186209 A1    Dec. 12, 2002

(51) Int. Cl.
*G09G 5/00* (2006.01)

(52) U.S. Cl. .................. 345/173; 345/174; 345/175; 345/176; 345/177; 345/76

(58) Field of Classification Search ............. 345/173, 345/174–177, 76, 55; 315/169.1, 169.3; 178/18.01, 18.03, 18.05–18.07
See application file for complete search history.

(56) References Cited

U.S. PATENT DOCUMENTS

| | | |
|---|---|---|
| 4,769,292 A | 9/1988 | Tang et al. |
| 5,061,569 A | 10/1991 | VanSlyke et al. |
| 5,402,151 A * | 3/1995 | Duwaer ............ 345/173 |
| 5,446,569 A * | 8/1995 | Iwai et al. ............ 349/124 |
| 5,650,597 A | 7/1997 | Redmayne |
| 5,688,551 A | 11/1997 | Littman et al. |
| 5,796,454 A | 8/1998 | Ma |
| 5,796,509 A * | 8/1998 | Doany et al. ............ 359/254 |
| 6,211,613 B1 * | 4/2001 | May ............ 313/504 |
| 6,233,027 B1 * | 5/2001 | Unno et al. ............ 349/25 |
| 6,395,863 B1 * | 5/2002 | Geaghan ............ 528/196 |
| 6,403,223 B1 * | 6/2002 | Albro et al. ............ 428/421 |
| 6,429,451 B1 * | 8/2002 | Hung et al. ............ 257/40 |
| 6,483,498 B1 | 11/2002 | Colgan et al. |
| 6,485,884 B1 * | 11/2002 | Wolk et al. ............ 430/200 |
| 6,525,997 B1 * | 2/2003 | Narayanaswami et al. .. 368/223 |
| 6,559,834 B1 * | 5/2003 | Murakami et al. ............ 345/173 |
| 6,574,044 B1 * | 6/2003 | Sahouani et al. ............ 359/498 |
| 2002/0044065 A1 * | 4/2002 | Quist et al. ............ 340/815.4 |
| 2002/0048283 A1 * | 4/2002 | Lin ............ 370/495 |
| 2002/0145594 A1 * | 10/2002 | Derocher ............ 345/173 |

FOREIGN PATENT DOCUMENTS

EP    0 978 752 A1    2/2000

OTHER PUBLICATIONS

S. Smith, *Weighing in on touch technology*, Control Solutions, May 2000, pp. 1-3.
Osgood et al., *Touch Screen Controller Tips*, Burr-Brown Application Bulletin, AB-158, Apr. 2000, pp. 1-9.

\* cited by examiner

*Primary Examiner*—Richard Hjerpe
*Assistant Examiner*—Leonid Shapiro
(74) *Attorney, Agent, or Firm*—Andrew J. Anderson; Thomas H. Close

(57) ABSTRACT

A touch screen for use with an organic light emitting diode (OLED) display, includes: a substrate having a top side and a bottom side; a plurality of touch screen elements located on the top side of substrate; and a polarizing element for reducing glare and improving contrast of the OLED display, wherein the polarizing element is an integral part of the touch screen.

7 Claims, 5 Drawing Sheets

TOUCH SCREEN FOR USE WITH AN OLED DISPLAY

FIELD OF THE INVENTION

The present invention relates to touch screens for use with organic light emitting diode displays and, more particularly, to the use of circular polarizing elements to reduce glare and increase the display contrast.

BACKGROUND OF THE INVENTION

Emissive flat-panel display devices are widely used in conjunction with computing devices and in particular with portable devices. These displays are often used in portable devices or in public areas where the use of a keyboard in association with the computer used to drive the display is impractical. In these situations, a touch screen interface to the display is often employed.

A touch screen is a device placed over or above a display which provides a signal when the screen is mechanically touched. There are a variety of detection methods used including capacitive, surface acoustic wave, infrared, and resistive (with either four or five wires). With the exception of the infrared method, each of these methods relies on a hard substrate into or onto which various signals and detecting devices are built.

FIG. 1 shows a prior art touch screen 10. The touch screen 10 includes a transparent substrate 12. This substrate 12 is typically rigid, and is usually glass, although sometimes a flexible material, such as plastic, is used. Various additional layers of materials forming touch sensitive elements 14 of the touch screen 10 are formed on top of the substrate 12. The touch sensitive elements 14 include transducers and circuitry that are necessary to detect a touch by an object, in a manner that can be used to compute the location of such a touch. A cable 16 is attached to the circuitry so that various signals may be brought onto or off of the touch screen 10. The cable 16 is connected to an external controller 18. The external controller 18 coordinates the application of various signals to the touch screen 10, and performs calculations based on responses of the touch sensitive elements to touches, in order to extract the (X, Y) coordinates of the touch.

There are three commonly used touch screen technologies that utilize this basic structure: resistive, capacitive, and surface acoustic wave (SAW). For more information on these technologies, see "Weighing in on touch technology," by Scott Smith, published in Control Solutions Magazine, May 2000.

There are three types of resistive touch screens, 4-wire, 5-wire, and 8-wire. The three types share similar structures. FIG. 2a shows a top view of a resistive touch screen 10. FIG. 2b shows a side view of the resistive touch screen 10. The touch sensitive elements 14 of the resistive touch screen 10 includes a lower circuit layer 20, a flexible spacer layer 22 containing a matrix of spacer dots 24, a flexible upper circuit layer 26, and a flexible top protective layer 28. All of these layers are transparent. The lower circuit layer 20 often comprises conductive materials deposited on the substrate 12, forming a circuit pattern.

The main difference between 4-wire, 5-wire, and 8-wire touch screens is the circuit pattern in the lower circuit layer 20 and in the upper circuit layer 26, and the means for making resistance measurements. An external controller 18 is connected to the touch screen circuitry via cable 16. Conductors in cable 16 are connected to the circuitry within the lower circuit layer 20 and the upper circuit layer 26. The external controller 18 coordinates the application of voltages to the touch screen circuit elements. When a resistive touch screen is pressed, the pressing object, whether a finger, a stylus, or some other object, deforms the top protective layer 28, the upper circuit layer 26, and the spacer layer 22, forming a conductive path at the point of the touch between the lower circuit layer 20 and the upper circuit layer 26. A voltage is formed in proportion to the relative resistances in the circuit at the point of touch, and is measured by the external controller 18 connected to the other end of the cable 16. The controller 18 then computes the (X, Y) coordinates of the point of touch. For more information on the operation of resistive touch screens, see "Touch Screen Controller Tips," Application Bulletin AB-158, Burr-Brown, Inc. (Tucson, Ariz.), April 2000, pages 1–9.

FIG. 3a shows a top view of a capacitive sensing touch screen 10. FIG. 3b shows a side view of the capacitive sensing touch screen 10. The touch sensitive elements 14 include a transparent metal oxide layer 30 formed on substrate 12. Metal contacts 32, 34, 36, and 38 are located on the metal oxide layer 30 at the corners of the touch screen 10. These metal contacts are connected by circuitry 31 to conductors in cable 16. An external controller 18 causes voltages to be applied to the metal contacts 32, 34, 36, and 38, creating a uniform electric field across the surface of the substrate 12, propagated through the transparent metal oxide layer 30. When a finger or other conductive object touches the touch screen, it capacitively couples with the screen causing a minute amount of current to flow to the point of contact, where the current flow from each corner contact is proportional to the distance from the corner to the point of contact. The controller 18 measures the current flow proportions and computes the (X, Y) coordinates of the point of touch. U.S. Pat. No. 5,650,597, issued Jul. 22, 1997 to Redmayne describes a variation on capacitive touch screen technology utilizing a technique called differential sensing.

FIG. 4a shows a top view of a surface acoustic wave (SAW) touch screen 10. FIG. 4b shows a side view of a SAW touch screen 10. The touch sensitive elements 14 include an arrangement of acoustic transducers 46 and sound wave reflectors 48 formed on the face of substrate 12. The sound wave reflectors 48 are capable of reflecting high frequency sound waves that are transmitted along the substrate surface, and are placed in patterns conducive to proper wave reflection. Four acoustic transducers 46 are formed on the substrate 12 and are used to launch and sense sound waves on the substrate surface. A cable 16 is bonded to the substrate 12, and contains conductors that connect the acoustic transducers 46 to an external controller 18. This external controller 18 applies signals to the acoustic transducers 46, causing high frequency sound waves to be emitted across the substrate 12. When an object touches the touch screen, the sound wave field is disturbed. The transducers 46 detect this disturbance, and external controller 18 uses this information to calculate the (X, Y) coordinate of the touch.

FIG. 5 shows a typical prior art organic light emitting diode OLED flat panel display 49 of the type shown in U.S. Pat. No. 5,688,551, issued Nov. 18, 1997 to Littman et al. The OLED display includes substrate 50 that provides a mechanical support for the display device. The substrate 50 is typically glass, but other materials, such as plastic, may be used. Light-emitting elements 52 include conductors 54, a hole injection layer 56, an organic light emitter 58, an electron transport layer 60, and a metal cathode layer 62. When a voltage is applied by a voltage source 64 across the light emitting elements 52 via cable 67, light 66 is emitted through the substrate 50, or through a transparent cathode layer 62.

Conventionally, when a touch screen is used with a flat panel display, the touch screen is simply placed over the flat panel display and the two are held together by a mechanical mounting means such as a frame. FIG. 6 shows such a prior art arrangement with a touch screen mounted on an OLED flat panel display. After the touch screen and the OLED display are assembled, the two substrates 12 and 50 are placed together in a frame 68. Sometimes, a narrow air gap is added between the substrates 12 and 50 by inserting a spacer 72 to prevent Newton rings.

Flat-panel displays have a problem that is also present when touch screens are used in conjunction with the displays. Ambient light incident on the front surface of either the flat panel or the touch screen is reflected from the front surface to the viewer's eyes, as is illustrated in FIG. 7 (prior art). In FIG. 7 a touch screen with components 12 and 14 are placed above a display with components 50 and 52. Light 100 is reflected from the surfaces of the components together with emitted light 101. This reflected light 100, or glare, reduces the percentage of light from the light-emitting display 101 that reaches the viewer's eyes thereby reducing the perceived brightness and effective contrast of the display. This problem is commonly dealt with by placing polarizing filter (generally circular) between the viewer and the reflective surface. FIG. 8 illustrates this with a filter 110 placed above the display and FIG. 9 with a filter 110 placed above the touch screen. However, the use of additional filters within a composite flat-panel display with a touch screen creates additional processing steps, requires additional components, and creates additional interlayer reflections which raise cost, reduce reliability, and reduce.

There is a need therefore for an improved touch screen for use with an OLED flat panel display that reduces reflections and increases contrast of the display, while containing manufacturing costs.

SUMMARY OF THE INVENTION

The need is met according to the present invention by providing a touch screen for use with an organic light emitting diode (OLED) display that includes: a substrate having a top side and a bottom side; a plurality of touch screen elements located on the top side of substrate; and a polarizing element for reducing glare and improving contrast of the OLED display, wherein the polarizing element is an integral part of the touch screen.

ADVANTAGES

The present invention has the advantage that it reduces the costs and improves the reliability and performance of a touch screen that is used with an OLED flat-panel display by eliminating the need for a separate polarizing filter layer.

DETAILED DESCRIPTION OF THE INVENTION

According to the present invention, OLED display devices overcome the problem of ambient reflections by incorporating polarizing materials into an existing component of a touch screen employed with the OLED display. Polarizing glasses and plastic films are well known in the art and are available in sheet form and with the appropriate mechanical and chemical properties suitable for use within touch-screens and OLED displays.

Figure 10:
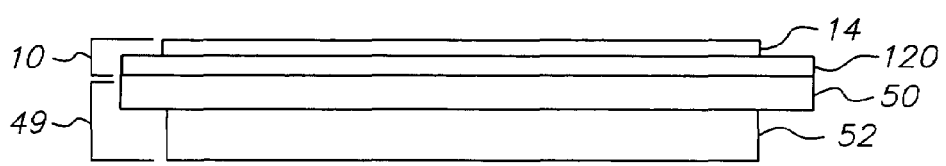
FIG. 10 is a diagram illustrating the present invention for a touch screen and emissive display.

There are several embodiments in which the present invention can be applied. In the first embodiment, the substrate 12 of the touch-screen itself incorporates the polarizing element. Referring to FIG. 10, a touch-screen 10 includes a polarizing substrate 120 (replacing substrate 12) and touch screen elements 14. The touch screen is placed above an OLED display 49 with a substrate 50 and light emitting elements 52. The polarizing substrate 120 absorbs the ambient light that passes through it while the light emitted from the OLED display 49 is not absorbed. A typical circular polarizer consists of a linear polarizer above a quarter-wave plate. As light passes through the linear polarizer it is polarized linearly. As the light passes through the quarter wave plate this polarization is converted to a rotational polarization. When light is reflected back, the rotation is reversed. As the reversed, reflected light passes through the quarter wave plate again in the opposite direction, the linear polarization is re-established but, because of the reversal, the polarization is at ninety degrees from the original and the light is absorbed by the linear polarizer. The emitted light passes though the circular polarizer only one time and is not absorbed. Circular polarizers are commercially available from 3M Inc. in both flexible plastic and rigid glass in a variety of configurations.

Figure 6:
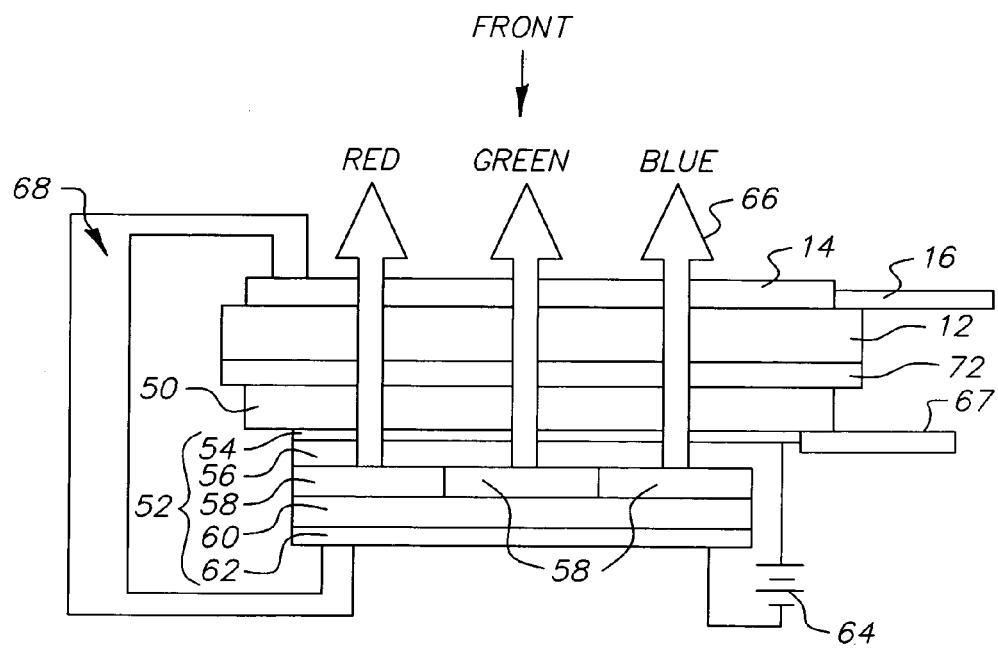
FIG. 6 is a schematic diagram showing the combination of a touch screen with an OLED display as would be accomplished in the prior art.
Figure 7:
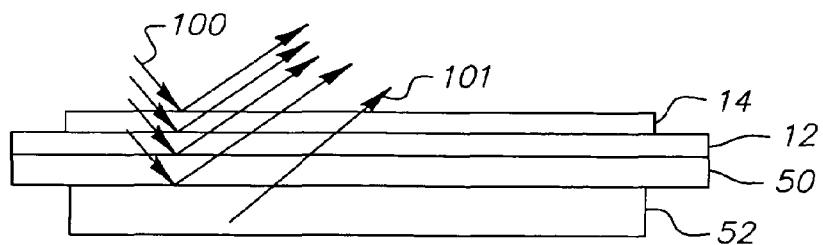
FIG. 7 is a diagram illustrating the problem of reflected light from the surface of a display device.
Figure 8:
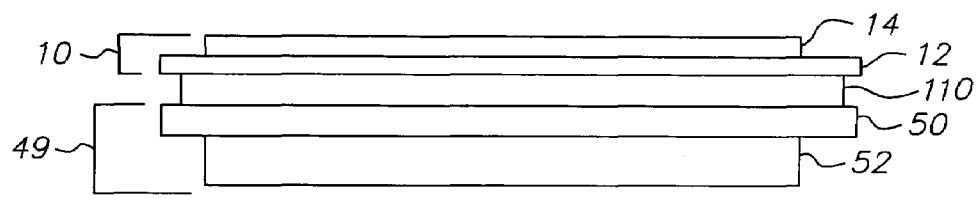
FIG. 8 is a diagram showing the use of polarizing filters to reduce glare as is implemented in the prior art.
Figure 9:
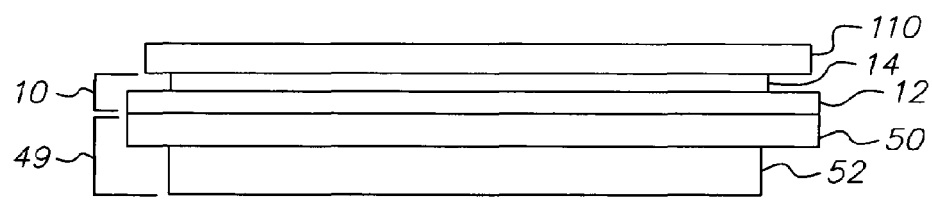
FIG. 9 is a diagram showing the use of polarizing filters to reduce glare as is implemented in the prior art.
Figure 11:
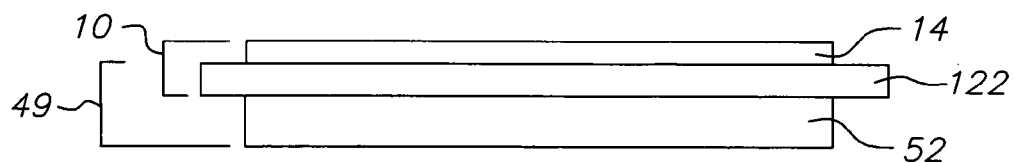
FIG. 11 is a diagram illustrating the present invention for a touch screen and emissive display wherein the touch screen and emissive display share a common substrate.

Referring to FIG. 11, in a second embodiment, a polarizing substrate 122 acts as both a substrate for the touch-screen 10 and a substrate for the OLED display 49, replacing elements 12 and 50, and eliminating the need for the spacer 72 in FIG. 6. In either embodiment shown in FIGS. 10 and 11, the present invention is applicable to capacitive, surface acoustic wave, or resistive touch screen technologies. These applications will differ only in the mechanical qualities of the substrate. For example, surface acoustic wave substrates are considerably thicker than is necessary for resistive devices.

Figure 1:
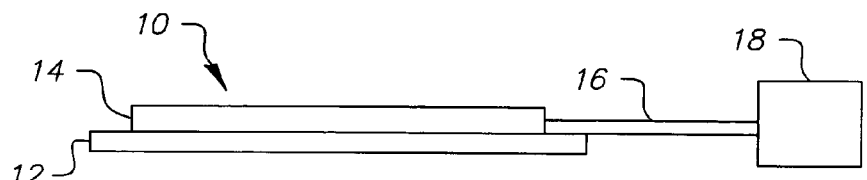
FIG. 1 is a schematic diagram showing the basic structure of a prior art touch screen.
Figure 2A:
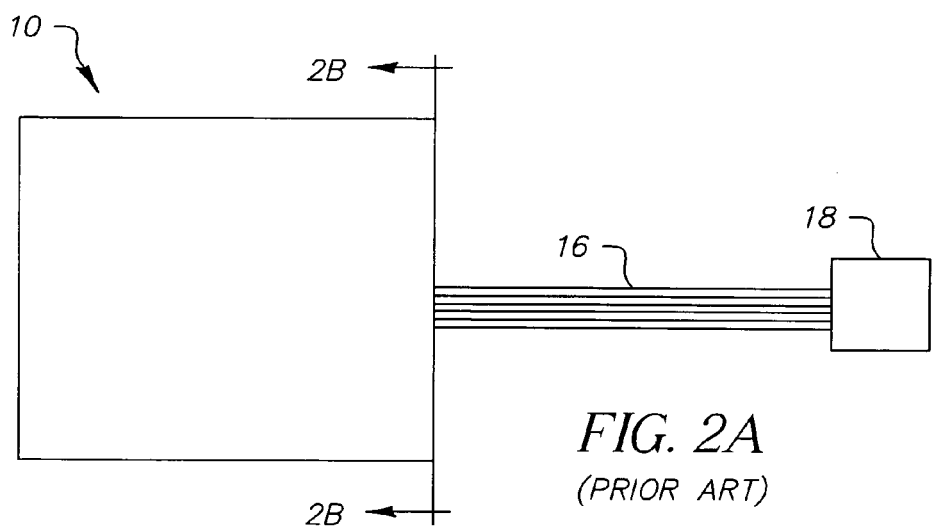
FIGS. 2a and 2b are schematic diagrams showing the structure of a prior art resistive touch screen.
Figure 2B:
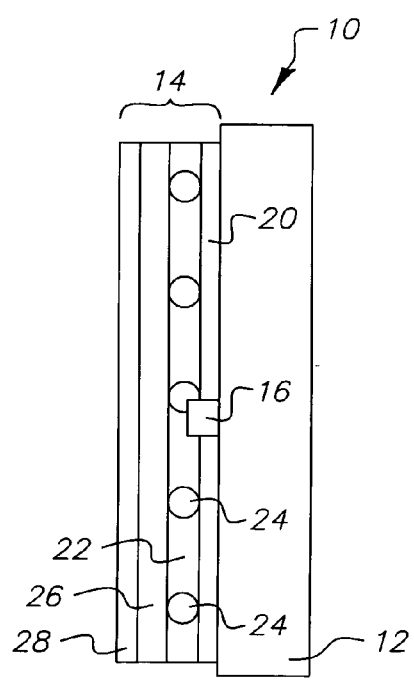
Figure 3A:
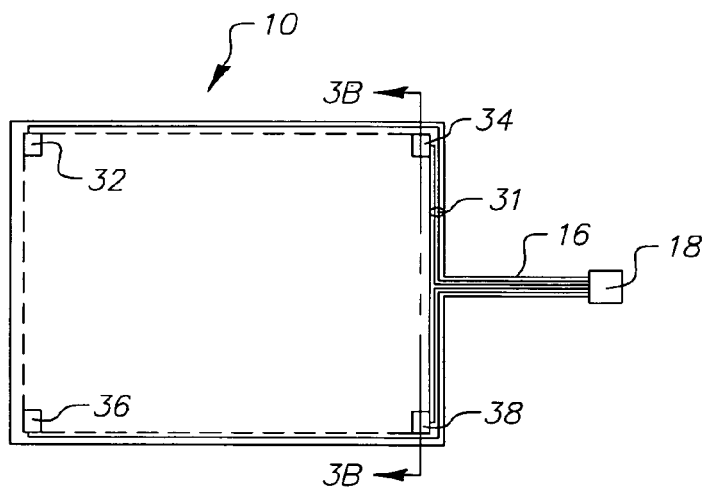
FIGS. 3a and 3b are schematic diagrams showing the structure of a prior art capacitive touch screen.
Figure 3B:
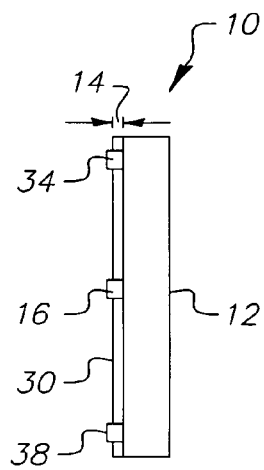
Figure 4A:
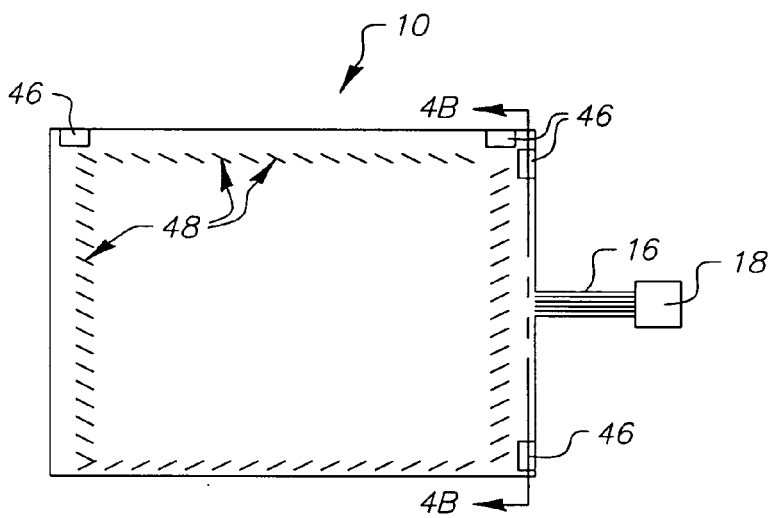
FIGS. 4a and 4b are schematic diagrams showing the structure of a prior art surface acoustic wave touch screen.
Figure 4B:
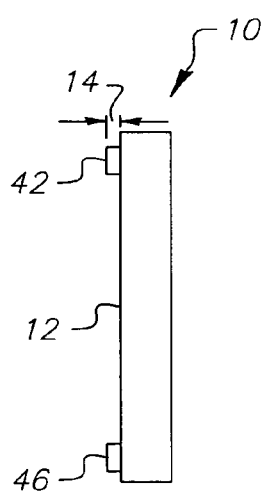
Figure 5:
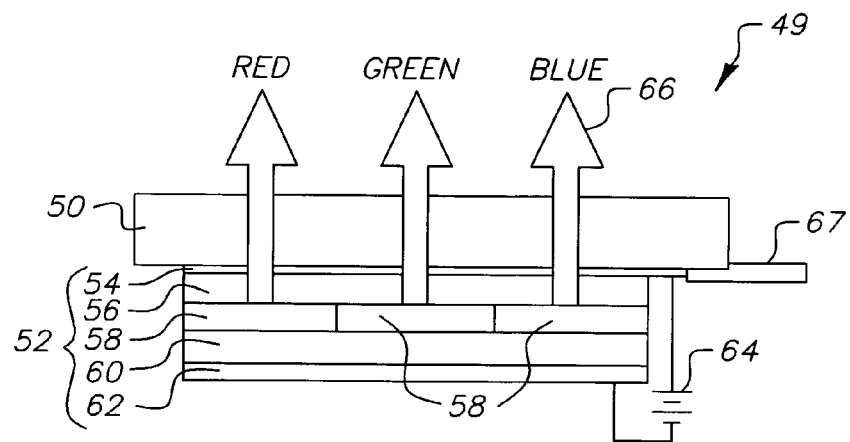
FIG. 5 is a schematic diagram showing the structure of a prior art organic light emitting diode (OLED) display.
Figure 12:
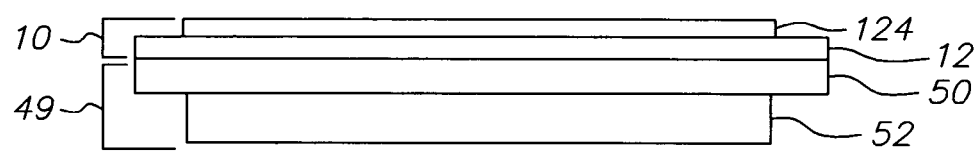
FIG. 12 is a diagram illustrating the present invention for a resistive touch screen and emissive display wherein the touch screen and emissive display share a common substrate.

Referring to FIG. 12, in a third embodiment applicable to resistive touch-screen devices, the substrate does not incorporate polarizing materials. Instead, the flexible polarizing protective layer 124 replaces the flexible protective layer 28 shown in FIG. 2*b*.

Figure 13:
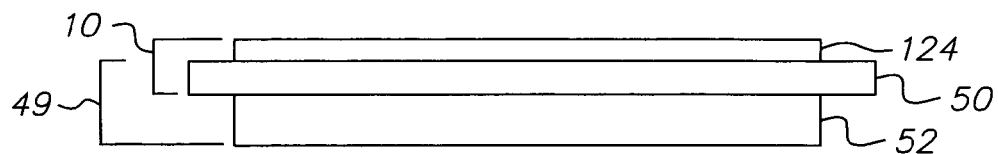
FIG. 13 is a diagram illustrating the present invention for a touch screen and emissive display wherein the touch screen and emissive display share a common substrate.

Referring to FIG. 13, in a fourth embodiment a resistive touch-screen 10 shares a common substrate 50 with an OLED display 49. A polarizing flexible protective layer 124 replaces the flexible protective layer 28 of the touch-screen components 14 in the touch screen 10 shown in FIG. 2*b*.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al. and U.S. Pat. No. 5,061,569, issued Oct. 29, 1991 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST

| | |
|---|---|
| 10 | touch screen |
| 12 | substrate |
| 14 | touch sensitive elements |
| 16 | cable |
| 18 | controller |
| 20 | lower circuit layer |
| 22 | flexible spacer layer |
| 24 | spacer dot |
| 26 | flexible upper circuit layer |
| 28 | flexible top protective layer |
| 30 | metal oxide layer |
| 31 | circuitry |
| 32 | metal contact |
| 34 | metal contact |
| 36 | metal contact |
| 38 | metal contact |
| 46 | acoustic transducer |
| 48 | acoustic surface wave reflector |
| 49 | OLED flat panel display |
| 50 | substrate |
| 52 | light emitting elements |
| 54 | conductors |

-continued

PARTS LIST

| | |
|---|---|
| 56 | hole injection layer |
| 58 | organic light emitters |
| 60 | electron transport layer |
| 62 | cathode layer |
| 64 | voltage source |
| 66 | light |
| 67 | cable |
| 68 | frame |
| 72 | spacer |
| 100 | light |
| 101 | emitted light |
| 110 | filter |
| 120 | polarizing substrate |
| 122 | polarizing substrate |
| 124 | flexible polarizing protective layer |

What is claimed is:

1. A touch screen for use with an organic light emitting diode (OLED) display, comprising:
    a) a substrate having a top side and a bottom, the OLED display being located on the bottom side of the substrate;
    b) a plurality of touch screen elements located on the top side of substrate; and
    c) a polarizing element for reducing glare and improving contrast of the OLED display, wherein the polarizing element is an integral part of the substrate;
    wherein the OLED display is a bottom emitting display having a substrate on which are deposited organic light emitting elements that emit light through the substrate of the display and the substrate of the display also serves as the substrate of the touch screen.

2. The touch screen claimed in claim 1, wherein the touch screen is a resistive wire touch screen.

3. The touch screen claimed in claim 2, wherein the resistive wire touch screen is a five-wire touch screen.

4. The touch screen claimed in claim 2, wherein the resistive wire touch screen is a four-wire touch screen.

5. The touch screen claimed in claim 1, wherein the touch screen is a surface acoustic wave touch screen.

6. The touch screen claimed in claim 1, wherein the touch screen is a capacitive touch screen.

7. The touch screen claimed in claim 1, wherein the polarizing element is a circular polarizer.

* * * * *